United States Patent
Ong et al.

(10) Patent No.: US 12,230,708 B2
(45) Date of Patent: Feb. 18, 2025

(54) SEMICONDUCTOR DEVICE AND A METHOD OF MANUFACTURING OF A SEMICONDUCTOR DEVICE WITH A RESURF OXIDE

(71) Applicant: NEXPERIA B.V., Nijmegen (NL)

(72) Inventors: Kilian Ong, Nijmegen (NL); Benjamin Hung, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 64 days.

(21) Appl. No.: 17/538,418

(22) Filed: Nov. 30, 2021

(65) Prior Publication Data

US 2022/0173243 A1 Jun. 2, 2022

(30) Foreign Application Priority Data

Dec. 1, 2020 (EP) .................................. 20210948

(51) Int. Cl.
*H01L 29/78* (2006.01)
*H01L 29/06* (2006.01)
*H01L 29/747* (2006.01)

(52) U.S. Cl.
CPC ........ *H01L 29/7825* (2013.01); *H01L 29/063* (2013.01); *H01L 29/747* (2013.01)

(58) Field of Classification Search
CPC .................................................. H01L 29/7825
See application file for complete search history.

(56) References Cited

U.S. PATENT DOCUMENTS

| | | | |
|---|---|---|---|
| 7,282,406 B2 * | 10/2007 | Grivna | ................ H01L 27/0922 257/E21.639 |
| 8,723,238 B1 | 5/2014 | Padmanabhan et al. | |
| 9,159,786 B2 | 10/2015 | Chen | |
| 2019/0019869 A1 * | 1/2019 | Hsu | .................... H01L 29/42336 |
| 2021/0074853 A1 | 3/2021 | Wang et al. | |

FOREIGN PATENT DOCUMENTS

WO    2020001033 A1    1/2020

OTHER PUBLICATIONS

Extended European Search Report and Written Opinion for corresponding European application EP20210948.4, 10 pages dated Apr. 20, 2021.

* cited by examiner

*Primary Examiner* — Tucker J Wright
(74) *Attorney, Agent, or Firm* — Ruggiero McAllister & McMahon LLC

(57) ABSTRACT

A semiconductor device is provided that includes a substrate, a channel with the channel positioned on the top of the substrate, and a drift with the drift positioned on the top of the channel. The semiconductor device further includes a first poly positioned in the channel and the drift, and a second poly positioned on the top of the first poly and positioned in the drift. The first poly and the second poly are isolated by a gate oxide and a RESURF oxide, respectively, from the channel and from the drift.

12 Claims, 5 Drawing Sheets

SEMICONDUCTOR DEVICE AND A METHOD OF MANUFACTURING OF A SEMICONDUCTOR DEVICE WITH A RESURF OXIDE

CROSS REFERENCE TO RELATED APPLICATION

This application claims the benefit under 35 U.S.C. § 119(a) of European Application No. 20210948.4 filed Dec. 1, 2020, the contents of which are incorporated by reference herein in their entirety.

BACKGROUND OF THE DISCLOSURE

1. Field of the Disclosure

The present disclosure relates to a semiconductor device. The disclosure also relates to a method of manufacturing of a semiconductor device.

2. Description of the Related Art

A known semiconductor device is shown in FIG. 1. It is known in such a chip scale packaging (CSP) product, that a drain-source on resistance (Rdson) is being contributed by a technology Rspec 10, a bidirectional resistance 12, a drain side substrate spreading resistance 14 and a drain side epitaxial (EPI) spreading resistance 16. It is known that both the bidirectional resistance 12 and the drain side EPI spreading resistance 16 can be reduced by a backside metallization and deep implants or deep metal, respectively. It is however problematic to manage the drain side substrate spreading resistance 14. This drain side substrate spreading resistance 14 is fixed for any voltage class. For a low breakdown (BV) voltage class the technology Rdson is low, but the total Rdson will be high as drain side substrate spreading resistance 14 directly adds up to the technology Rdson.

A known semiconductor device is described in U.S. Pat. No. 9,159,786B2. This device is shown in FIG. 2. A simplified cross-sectional view of a dual gate lateral MOSFET 100 is shown. The dual gate lateral MOSFET 100 includes a substrate 103 with a first conductivity and an epitaxial region 102 with a second conductivity grown from the substrate 103. A first drain/source region 112 and a second drain/source region 114 formed in the epitaxial region 102 over the substrate 103. An isolation region 104 is formed between the first drain/source region 112 and the second drain/source region 114.

The dual gate lateral MOSFET further comprises a body region 122 with the first conductivity formed in the epitaxial region 102 over the substrate 103. As shown in FIG. 1, the body region is formed underneath the second drain/source region 114. The dual gate lateral MOSFET 100 comprises two gates stacked together. The first gate 142 is on top of the second gate 144. The first gate 142 and the second gate 144 are separated by a dielectric layer 146. The first gate 142 is coupled to a control signal. When the control signal is greater than the threshold voltage of the dual gate lateral MOSFET 100, the dual gate lateral MOSFET 100 is turned on. When the control signal is less than the threshold voltage, the dual gate lateral MOSFET 100 is turned off. The second gate 144 is a floating gate.

A sidewall dielectric layer 128 and a bottom dielectric layer 126 provide isolation between dual gates 142, 144 and their surrounding semiconductor regions. A spacer 132 provides isolation between the first gate 142 and the second drain/source region 114. The isolation region 104 is used to isolate active regions so as to prevent leakage current from flowing between adjacent active regions.

SUMMARY

Various example embodiments are directed to the disadvantage as described above and/or others which may become apparent from the following disclosure.

According to an embodiment of this disclosure a semiconductor device comprises:
- a substrate,
- a channel, the channel positioned on the top of the substrate,
- a drift, the drift positioned on the top of the channel,
- a first poly positioned within the channel and the drift,
- a second poly positioned on the top of the first poly, and positioned within the drift,
- wherein the first poly and the second poly are isolated by a gate oxide and a RESURF oxide respectively, from the channel and from the drift.

Such a semiconductor device secures significantly improved breakdown voltage between the source and the drain of the semiconductor device.

The second poly is significantly or at least two times thicker compared to the first poly.

The second poly is connected to a gate or to a source of the semiconductor device, or it can be floating.

The semiconductor device can be a bi-directional MOSFET device, or any other suitable semiconductor device.

The disclosure also related to a method of manufacturing of a semiconductor device.

According to an embodiment of the disclosure the method comprises the steps:
- creating a body;
- creating a N-well for a N-channel and a P-well for a P-channel, wherein the N-well and the P-well form a drift area, and wherein the drift area is positioned on the top of the body;
- etching a first trench;
- growing a self-aligned contact (SAC) oxide and a gate oxide (GOX) within the first trench;
- deposing a first poly in the first trench;
- removing a top part of the first poly;
- deposit a RESURF oxide on the top of the first poly;
- deposit or grow a second poly on the top of the RESURF oxide; and
- inserting a high concentration implant so to form a source, a drain and a contact open so to pick up the source and the drain.

BRIEF DESCRIPTION OF THE DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale.

Advantages of the subject matter claimed will become apparent to those skilled in the art upon reading this description in conjunction with the accompanying figures, in which like reference numerals have been used to designate like elements, and in which:

DETAILED DESCRIPTION

Figure 1:
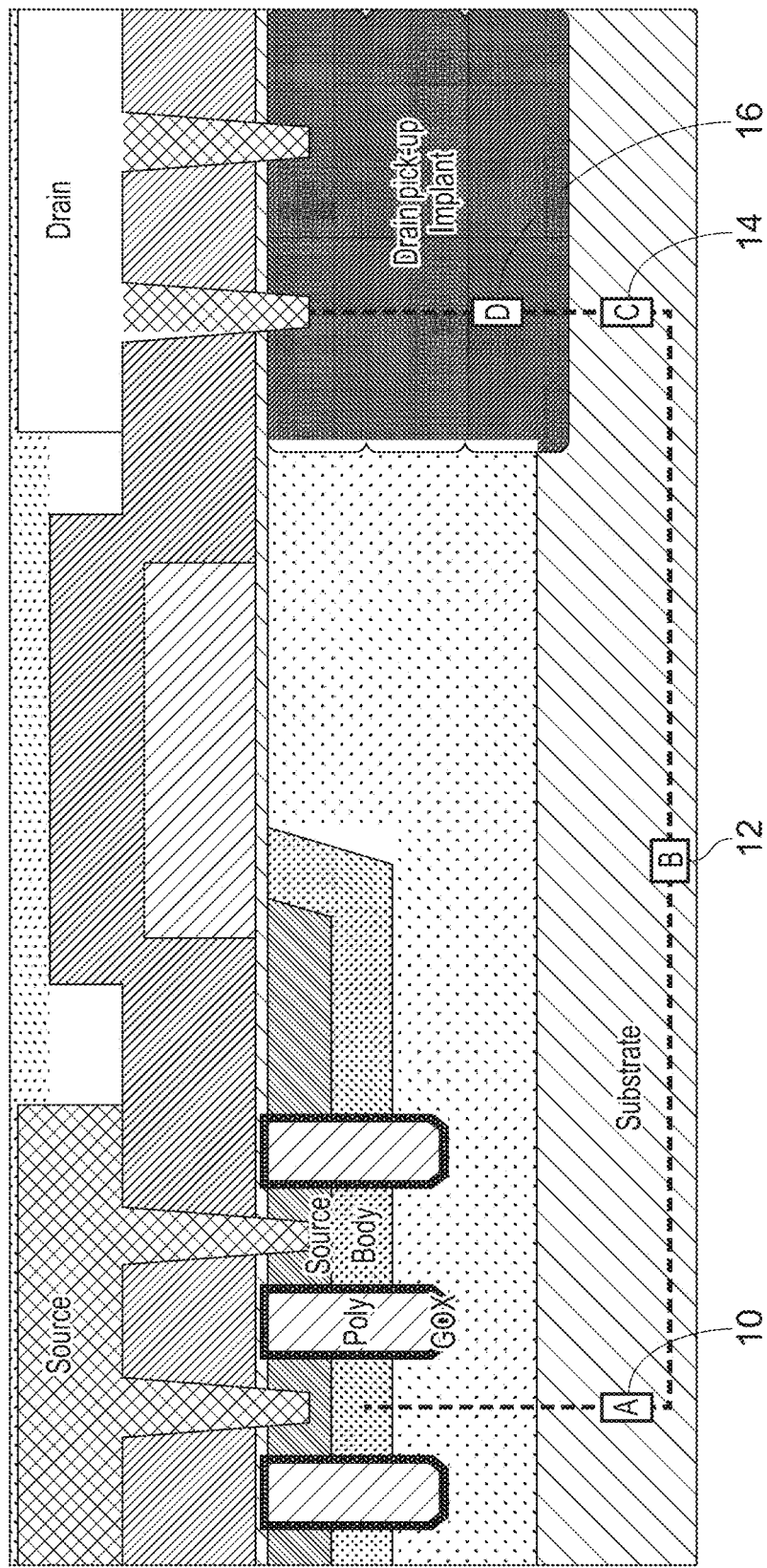
FIG. 1 shows a known semiconductor device.
Figure 2:
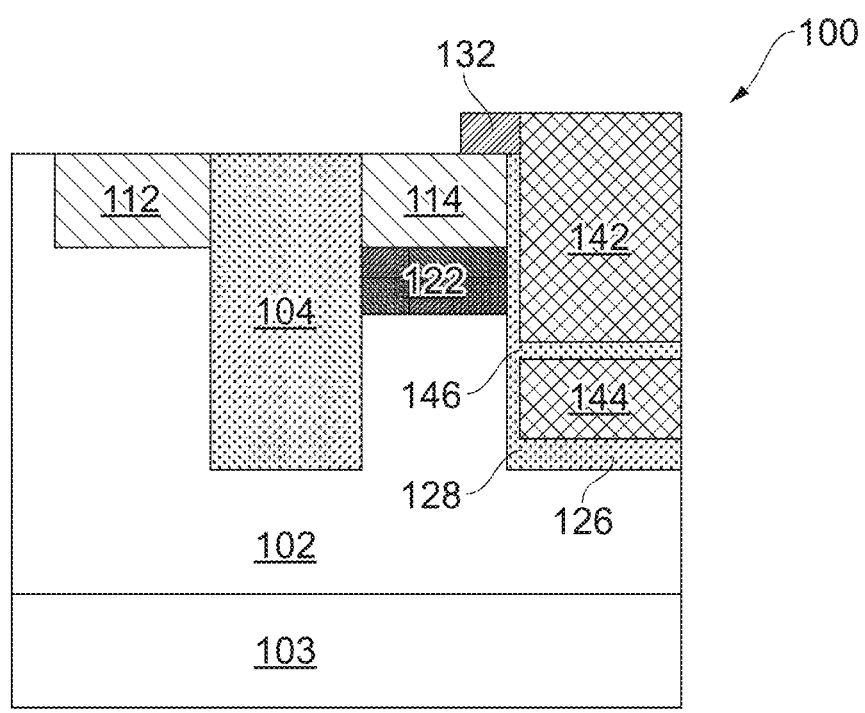
FIG. 2 shows a known semiconductor device.
Figure 3:
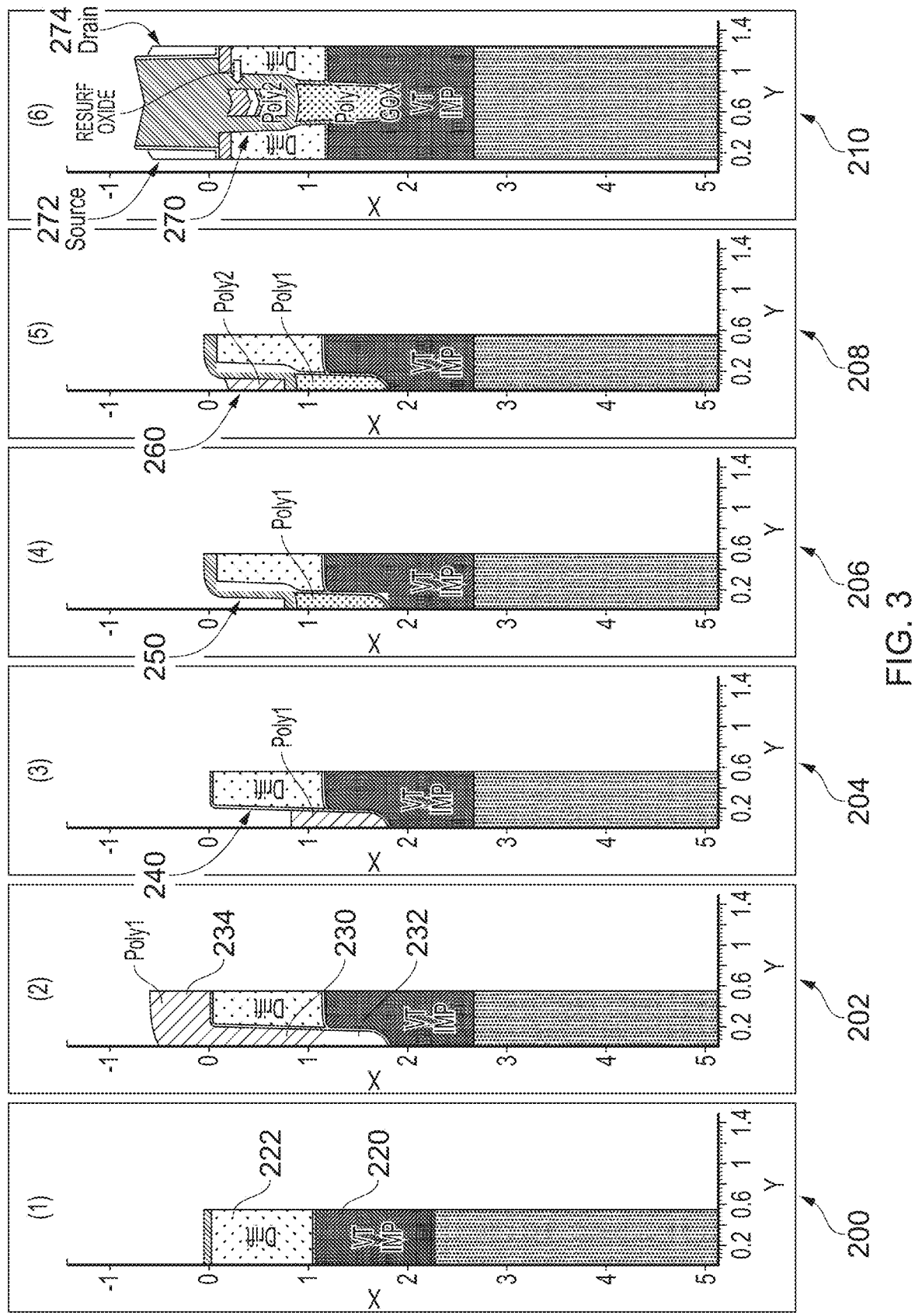
FIG. 3 illustrates a method of manufacturing a semiconductor device according to an embodiment of the disclosure.

FIG. 3 illustrates a method for creation of a semiconductor device embodiment of the disclosure. The method comprises steps:

Step with the reference number 200:
  creation of a body 220;
  creation of a N-well for a N-channel and a P-well for a P-channel; the N-well and the P-well form a drift area 222; the drift area 222 is positioned on the top of the body 220;

Step with the reference number 202:
  etching a first trench 230;
  growing a self-aligned contact (SAC) oxide and a gate oxide (GOX) 232 within the first trench 230;
  deposing a first poly 234 in the first trench 230;

Step with the reference number 204:
  removing a top part 240 of the first poly 234;

Step with the reference number 206:
  Deposit or grow a RESURF oxide 250 on the top; the RESURF oxide secures the increase of the breakdown voltage of the semiconductor device;

Step with the reference number 208:
  deposit a second poly 260 on the top of the RESURF oxide 250;

Step with the reference number 210:
  inserting a high concentration implant 270 so to form a source 272, a drain 274 and a contact open to pick up the source and the drain;

The semiconductor devices manufactured according to this method has better performance compared to the semiconductor devices known in the art. The first poly 234 is the gate poly and it uses the trench bottom as the channel to operate the semiconductor device. The second poly 260 can be connected to the gate or to the source or floating. The second poly 260 having the RESURF oxide which is a thick thermal or deposition oxide significantly increases the breakdown voltage of the semiconductor device.

Figure 4:
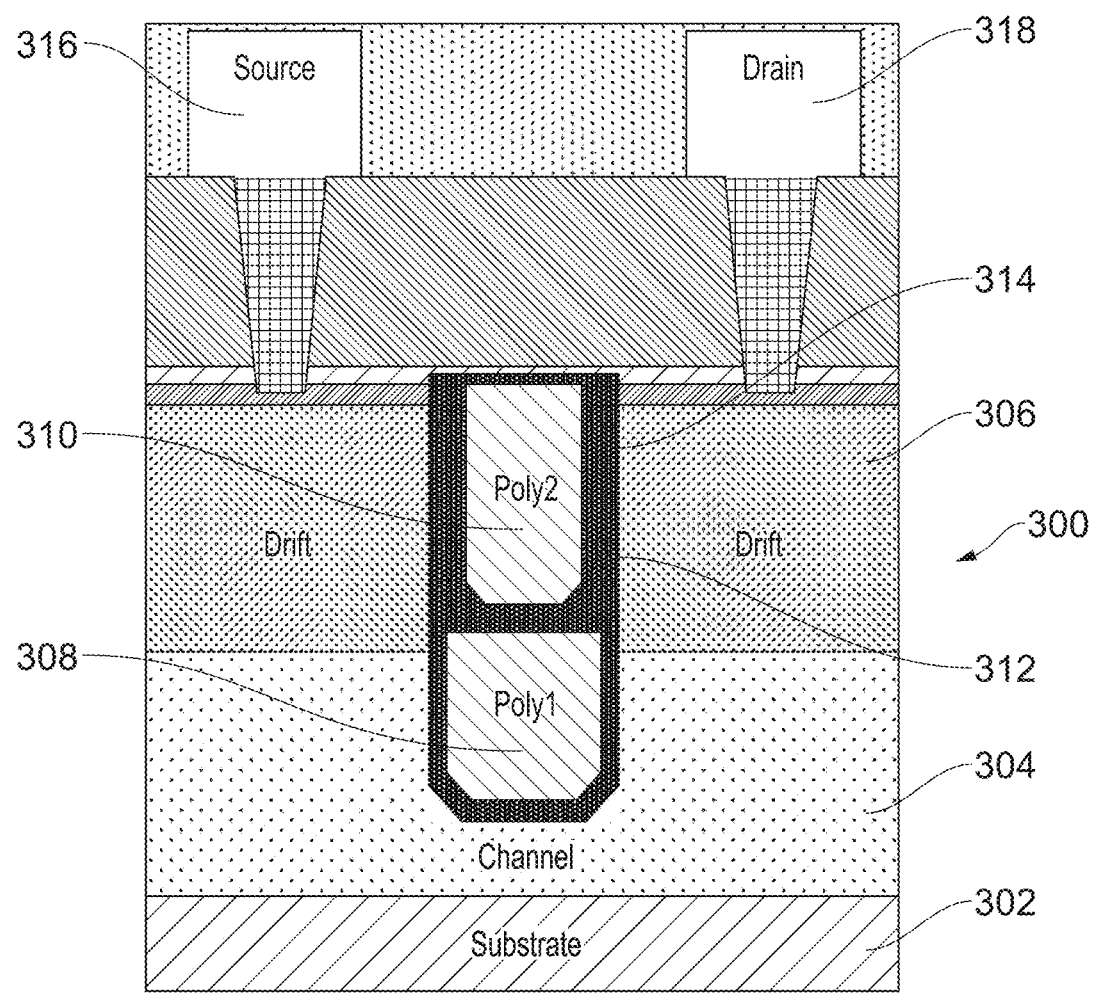
FIG. 4 illustrates a semiconductor device according to an embodiment of the disclosure.

A semiconductor device according to an embodiment of the disclosure is shown in FIG. 4. The semiconductor device 300 comprises:
  a substrate 302,
  a channel 304, the channel 304 positioned on the top of the substrate 302,
  a drift 306, the drift positioned on the top of the channel 304,
  a first poly 308 positioned within the channel 304 and the drift 306,
  a second poly 310 positioned on the top of the first poly 308, and positioned within the drift 306,
  wherein the first poly 308 and the second poly 310 are isolated by a gate oxide 312 and a RESURF oxide 314 respectively, from the channel 304 and from the drift 306.

Figure 5:
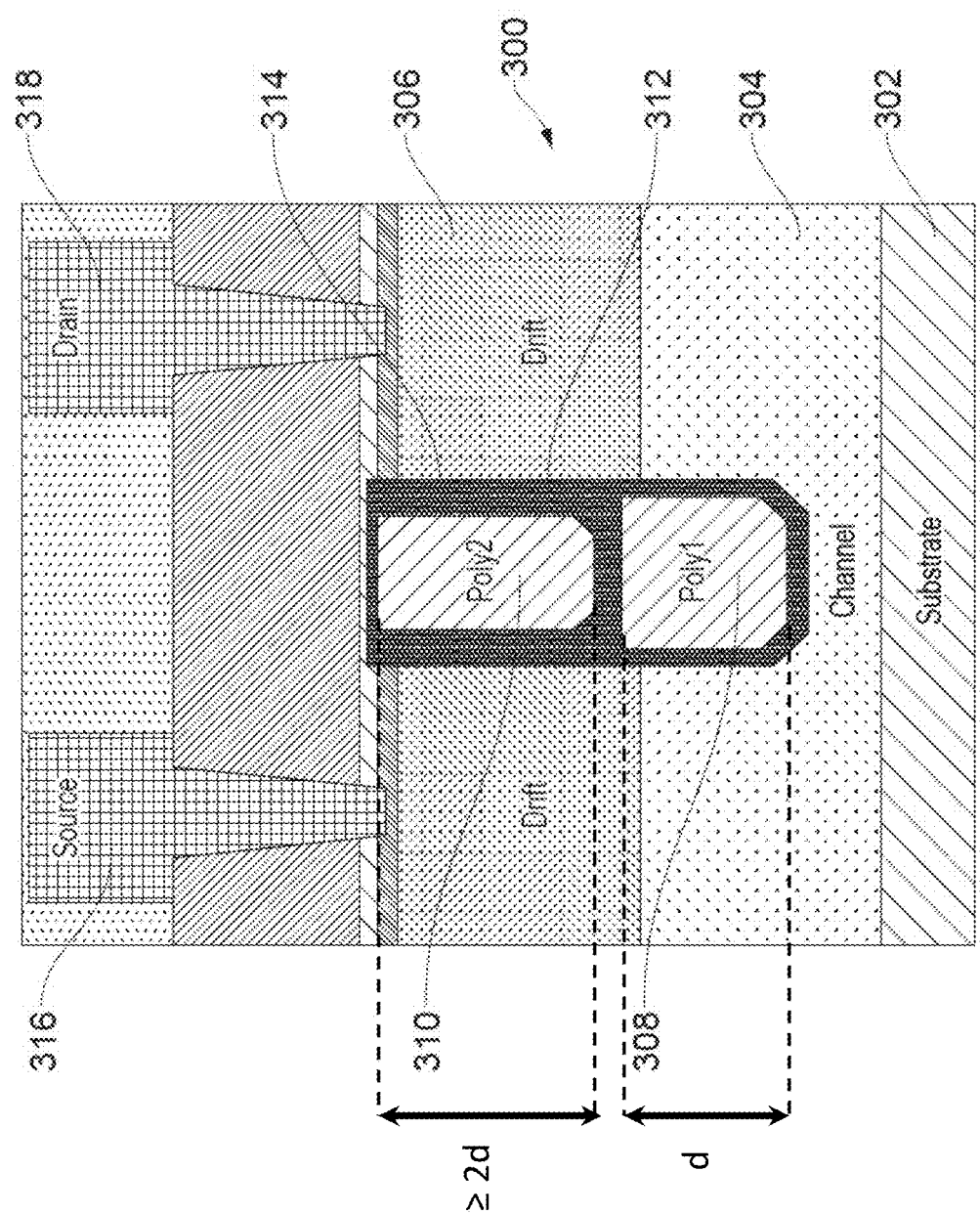
FIG. 5 illustrates a semiconductor device according to an embodiment of the disclosure.

As shown in FIG. 5, the second poly can be significantly thicker than the first poly. The semiconductor device further comprises a source 316 and a drain 318.

Furthermore, the second poly 310 can be connected to a gate or to a source or floating with a thick thermal or deposition oxide as a RESURF to increase the breakdown voltage between the drain and source.

The semiconductor device can be a bi-directional MOSFET device or any other suitable semiconductor device.

Particular and preferred aspects of the disclosure are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed disclosure or mitigate against any or all of the problems addressed by the present disclosure. The applicant hereby gives notice that new claims may be formulated to such features during prosecution of this application or of any such further application derived therefrom. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

The term "comprising" does not exclude other elements or steps, the term "a" or "an" does not exclude a plurality. Reference signs in the claims shall not be construed as limiting the scope of the claims.

What is claimed is:

1. A semiconductor device comprising:
  a substrate having a top,
  a channel having a top, the channel positioned on the top of the substrate,
  a drift, the drift positioned on the top of the channel,
  a first poly having a top, and positioned in the channel and the drift, and
  a second poly positioned on the top of the first poly, and positioned in the drift, wherein the second poly is at least two times thicker than the first poly and a top surface of the second poly is not recessed in the drift, and
  wherein the first poly and the second poly are isolated by a gate oxide and a RESURF oxide, respectively, from the channel and from the drift.

2. The semiconductor device as claimed in claim 1, further comprising a gate and a source; and wherein the second poly is connected to the gate or to the source.

3. The semiconductor device as claimed in claim 2, wherein the semiconductor device is a bi-directional MOSFET device.

4. The semiconductor device as claimed in claim 2, wherein the second poly is floating.

5. The semiconductor device as claimed in claim 1, wherein the second poly is floating.

6. The semiconductor device as claimed in claim 5, wherein the semiconductor device is a bi-directional MOSFET device.

7. The semiconductor device as claimed in claim 1, wherein the semiconductor device is a bi-directional MOSFET device.

8. A method of producing the semiconductor device according to claim 1, comprising:
- forming the channel positioned on the top of the substrate,
- forming the drift positioned on the top of the channel,
- forming the first poly positioned in the channel and the drift, and
  - forming the second poly positioned on the top of the first poly, and positioned in the drift, wherein the second poly is at least two times thicker than the first poly and a top surface of the second poly is not recessed in the drift, and
  - wherein the first poly and the second poly are isolated by the gate oxide and the RESURF oxide, respectively, from the channel and from the drift.

9. The method of producing the semiconductor device as claimed in claim 8, further comprising forming a gate and a source, and wherein the second poly is connected to the gate or to the source.

10. The method of producing the semiconductor device as claimed in claim 8, wherein the second poly is floating.

11. The method of producing semiconductor device as claimed in claim 8, wherein the semiconductor device is a bi-directional MOSFET device.

12. A method of producing a semiconductor device, the method comprising the steps of:
- creating a body with a top;
- creating a N-well for a N-channel and a P-well for a P-channel, wherein the N-well and the P-well form a drift area, and wherein the drift area is positioned on the top of the body;
- etching a first trench;
- growing a self-aligned contact (SAC) oxide and a gate oxide (GOX) within the first trench;
- depositing a first poly in the first trench;
- removing a top part of the first poly;
- depositing or growing a RESURF oxide on a top of the first poly;
- depositing a second poly on a top of the RESURF oxide, wherein the second poly is at least two times thicker than the first poly and a top surface of the second poly is not recessed in the drift; and
- inserting a high concentration implant to form a source, a drain and a contact open to pick up the source and the drain.

* * * * *